(12) United States Patent
Ohashi et al.

(10) Patent No.: US 10,983,669 B2
(45) Date of Patent: Apr. 20, 2021

(54) DEVICE FOR DISPLAYING DATA ASSOCIATED WITH OPERATION OF A PLURALITY OF ELECTRONIC COMPONENT MOUNTING MACHINES AT A PRODUCTION SITE

(71) Applicant: FUJI CORPORATION, Chiryu (JP)

(72) Inventors: Teruyuki Ohashi, Anjo (JP); Shigenao Otane, Himeji (JP)

(73) Assignee: FUJI CORPORATION, Chiryu (JP)

( * ) Notice: Subject to any disclaimer, the term of this patent is extended or adjusted under 35 U.S.C. 154(b) by 342 days.

(21) Appl. No.: 14/910,329

(22) PCT Filed: Aug. 9, 2013

(86) PCT No.: PCT/JP2013/071668
§ 371 (c)(1),
(2) Date: Feb. 5, 2016

(87) PCT Pub. No.: WO2015/019492
PCT Pub. Date: Feb. 12, 2015

(65) Prior Publication Data
US 2016/0179300 A1    Jun. 23, 2016

(51) Int. Cl.
*G05B 19/409*    (2006.01)
*G06F 3/0482*    (2013.01)
(Continued)

(52) U.S. Cl.
CPC ....... *G06F 3/0482* (2013.01); *G05B 19/4155* (2013.01); *G05B 19/41845* (2013.01);
(Continued)

(58) Field of Classification Search
CPC .............. H05K 13/08; G05B 19/41805; G06F 3/04847
(Continued)

(56) References Cited

U.S. PATENT DOCUMENTS 5,602,982 A * 2/1997 Judd .................. G09B 19/0053
715/709
6,144,452 A * 11/2000 Hachiya ................. G01B 11/14
356/615
(Continued)

FOREIGN PATENT DOCUMENTS

JP    11 203338    7/1999
JP    2000 196299    7/2000
(Continued)

OTHER PUBLICATIONS

Extended European Search Report dated Sep. 23, 2016 in Patent Application No. 13891322.3.
(Continued)

*Primary Examiner* — Henry Orr
(74) *Attorney, Agent, or Firm* — Oblon, McClelland, Maier & Neustadt, L.L.P.

(57) ABSTRACT

A device displays contents of data used by an electronic component mounting machine. The data includes necessity information regarding a plurality of optional functions. The optional functions are functions which are selectively used among the functions of the electronic component mounting machine, and the necessity information is information which describes necessity of use of each of optional functions. The device includes an extraction processing section and a display section. The extraction processing section extracts the necessity information regarding a plurality of optional functions from the data used by the electronic component mounting machine. The display section visually displays the necessity information regarding the plurality of optional functions extracted by the extraction processing section.

15 Claims, 6 Drawing Sheets

(51) Int. Cl.
   *G05B 19/4155* (2006.01)
   *G06F 3/0484* (2013.01)
   *H05K 13/08* (2006.01)
   *G05B 19/418* (2006.01)
   *G06F 3/0481* (2013.01)
   *G06T 11/20* (2006.01)

(52) U.S. Cl.
   CPC ...... *G06F 3/04817* (2013.01); *G06F 3/04842* (2013.01); *G06F 3/04845* (2013.01); *G06F 3/04847* (2013.01); *G06T 11/206* (2013.01); *H05K 13/08* (2013.01); *G05B 19/409* (2013.01); *G05B 2219/25417* (2013.01); *G05B 2219/35304* (2013.01); *G05B 2219/36195* (2013.01); *Y02P 90/02* (2015.11)

(58) Field of Classification Search
   USPC .......................................................... 715/771
   See application file for complete search history.

(56) References Cited

U.S. PATENT DOCUMENTS

| | | | | |
|---|---|---|---|---|
| 2002/0154153 A1* | 10/2002 | Messinger | .............. | G06F 9/453 715/705 |
| 2003/0222898 A1* | 12/2003 | Macomber | .............. | G06F 9/453 715/709 |
| 2004/0153868 A1* | 8/2004 | Nonaka | ................. | G06Q 10/10 714/47.2 |
| 2005/0096770 A1 | 5/2005 | Chua et al. | | |
| 2005/0096957 A1 | 5/2005 | Bayoumi et al. | | |
| 2005/0114785 A1* | 5/2005 | Finnigan | ................. | G06F 9/453 715/762 |
| 2006/0119890 A1* | 6/2006 | Nakajima | ............. | G06F 3/1204 358/1.15 |
| 2008/0037368 A1* | 2/2008 | Newman | ................. | E21B 17/00 367/69 |
| 2010/0005198 A1* | 1/2010 | Satomi | ............... | H04N 1/00411 710/16 |
| 2010/0050429 A1* | 3/2010 | Maenishi | ............. | H05K 1/0269 29/832 |
| 2012/0151394 A1* | 6/2012 | Locke | ................. | G06F 3/04817 715/765 |
| 2012/0326962 A1* | 12/2012 | Asai | ................... | H04N 1/00474 345/156 |
| 2015/0148934 A1* | 5/2015 | Maenishi | ......... | G05B 19/41865 700/121 |

FOREIGN PATENT DOCUMENTS

| | | |
|---|---|---|
| JP | 2007 281227 | 10/2007 |
| JP | 2011055011 | * 3/2011 |

OTHER PUBLICATIONS

International Search Report dated Oct. 15, 2013, in PCT/JP2013/071668 filed Aug. 9, 2013.
Office Action dated Mar. 21, 2018 in Chinese Patent Application No. 201380078704.4 (English translation only).

* cited by examiner

DEVICE FOR DISPLAYING DATA ASSOCIATED WITH OPERATION OF A PLURALITY OF ELECTRONIC COMPONENT MOUNTING MACHINES AT A PRODUCTION SITE

TECHNICAL FIELD

The present specification relates to a technology for mounting electronic components on a circuit board, particularly to a technology for displaying contents of data used by an electronic component mounting machine.

BACKGROUND ART

An electronic component mounting machine which mounts electronic components on a circuit board is known. An operation of the electronic component mounting machine is controlled based on a production program and part data which are prepared in advance. The production program generally describes a plurality of electronic components to be mounted on the circuit board, and positions on the circuit board on which each of the electronic components is to be mounted. In general, the production program is prepared for each production item (the type of the circuit board on which the electronic components are mounted). An electronic component mounting machine mounts each of the electronic components described in the production program, on the corresponding mounting positions on the circuit board, by the operation based on the production program.

Meanwhile, the part data is generally prepared for each type of the electronic component. In the part data, an operation condition when the electronic component mounting machine mounts the electronic components is described. For example, in the part data, a supply state of the electronic components, the moving speed of a mounting head, an imaging state for an image recognition, and collation data, are described. When each of the electronic components described in the production program is mounted, the electronic component mounting machine refers to the part data which corresponds to the electronic component, and operates under the operation condition described in the part data. Accordingly, the operation of the electronic component mounting machine appropriately changes in accordance with the electronic component to be mounted. An example of data used by the electronic component mounting machine, such as the production program or the part data, is described in PTL 1.

CITATION LIST

Patent Literature

PTL 1: JP-A-2001-337712

BRIEF SUMMARY

Problem to be Solved

In recent years, an electronic component mounting machine has been multi-functionalized, and the electronic component mounting machine having a plurality of optional functions has been widely used. The optional functions of the electronic component mounting machine are functions which are selectively used as necessary, and examples thereof include checking coplanarity or dipping flux. For this reason, in the data (for example, the production program or the part data) which instructs the operation condition to the electronic component mounting machine, information (hereinafter, referred to as necessity information) which describes necessity of use of each optional function is given.

On a production site where a plurality of electronic component mounting machines exist, an electronic component mounting machine which has the optional functions and an electronic component mounting machine which does not have the optional functions may co-exist. On such a production site, when allocating a plurality of production lots to the plurality of electronic component mounting machines, it is necessary for an operator to confirm the necessity of the optional functions with respect to each production lot. In other words, with respect to the production lot in which the optional functions are necessary, it is necessary to allocate the production lot to the electronic component mounting machine which has the optional functions, and with respect to the production lot in which the optional functions are unnecessary, it is necessary to preferentially allocate the production lot to a production line (electronic component mounting machine) which does not have the optional functions.

It is possible to confirm which optional function is necessary for each of the production lots with reference to the necessity information in data (the production program or the part data) used by the electronic component mounting machine for the production lot. However, in the data used by the electronic component mounting machine, the necessity information regarding the plurality of optional functions is described. In addition, with the technology in the related art, it is not possible to effectively display the necessity information regarding the plurality of optional functions, and an operation of confirming the necessity information regarding all of the optional functions one by one is troublesome work for the operator.

In consideration of the above-described situation, the present specification discloses a technology for making it easy for an operator to confirm necessity information regarding a plurality of optional functions.

Means for Solving the Problem

The present specification discloses a device for displaying contents of data used by an electronic component mounting machine. Here, the data means data including necessity information regarding a plurality of optional functions in a broad sense, and is not limited to specific data. In addition, the optional functions are functions which are selectively used among the functions of the electronic component mounting machine, and the necessity information is information which describes necessity of use of each optional function.

A device disclosed in the present specification includes an extraction processing section and a display section. The extraction processing section can extract the above-described necessity information regarding the plurality of optional functions, from data used by the electronic component mounting machine. The display section can visually display the necessity information regarding the plurality of optional functions extracted by the extraction processing section. By the display device, for example, when allocating the production lot to any of the electronic component mounting machines, the operator can easily confirm the plurality of optional functions which are considered necessary for the electronic component mounting machine, from the data used by the electronic component mounting machine for the production lot.

Here, an aspect for displaying the necessity information regarding the plurality of optional functions by the display section is not particularly limited. For example, the display section may display the necessity information regarding the plurality of optional functions at the same time. Otherwise, the display section may display the necessity information regarding the plurality of optional functions one by one in order. In general, it is preferable that the display section displays the necessity information regarding the plurality of optional functions without performing many operations by the operator.

DESCRIPTION OF EMBODIMENTS

Figure 1:
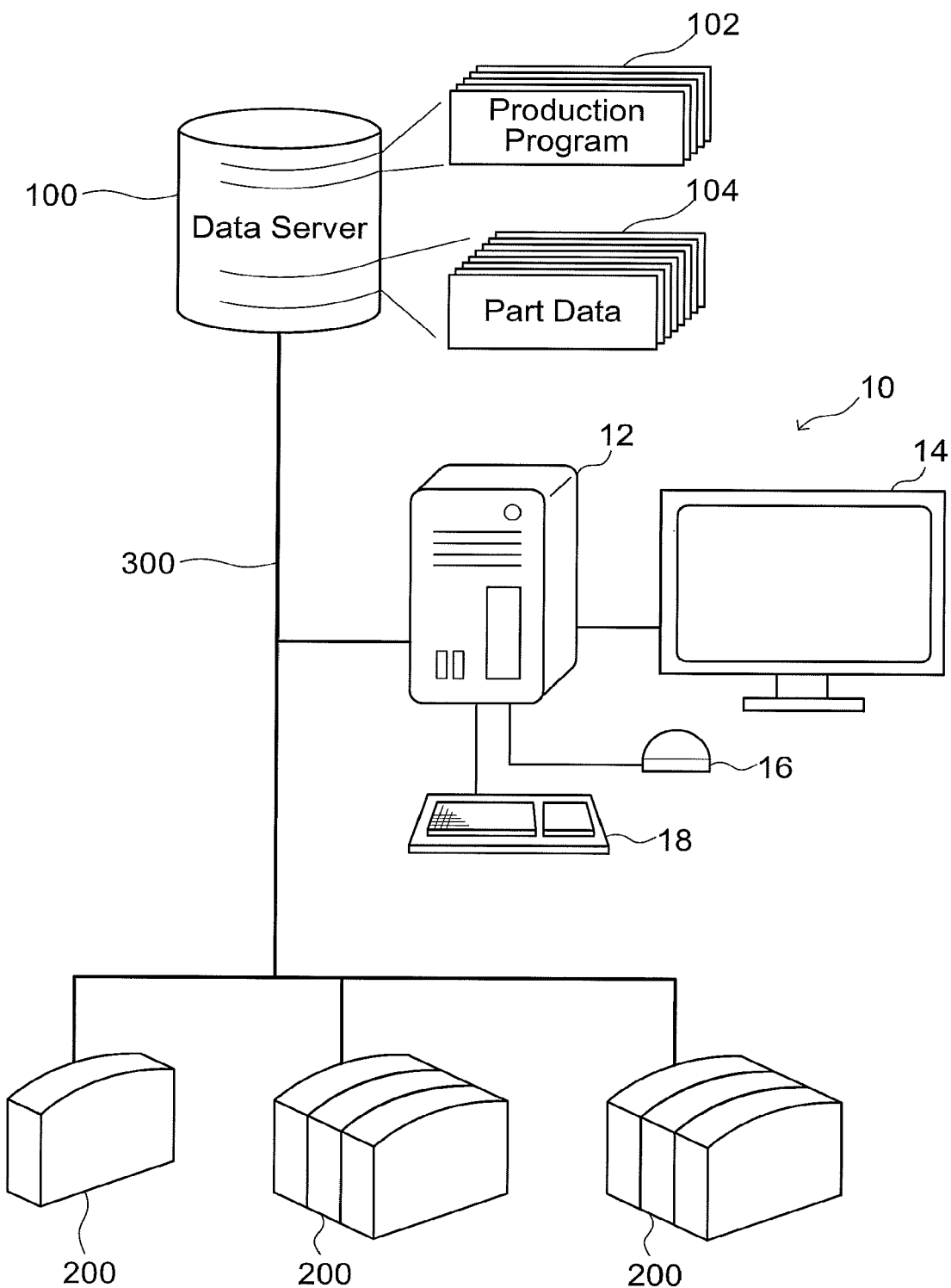
FIG. 1 is a view illustrating a configuration of an electronic component mounting system.

In one embodiment of the present technology, data which is data used by an electronic component mounting machine, and in which contents thereof are displayed by a display device, can be used as job data, a production program, and part data. Here, the job data generally describes the production item and the volume of production, and for example, can be prepared for each production lot. As described above, the production program is data which describes a plurality of electronic components to be mounted on a circuit board, and positions on the circuit board on which each electronic component is to be mounted, and for example, can be prepared for each production item. As described above, the part data is data which describes an operation condition when the electronic component mounting machine mounts the electronic component, and for example, is prepared for each type of the electronic components.

In the embodiment of the present technology, it is preferable that the display section displays the plurality of optional functions which are described as necessary by the necessity information. In this case, it is not necessary for the display section to necessarily display one or a plurality of optional functions which are described as unnecessary by the necessity information. In other words, the display section may display only the plurality of optional functions which are described as necessary by the necessity information. In this configuration, the operator easily specifies the optional functions which are considered necessary.

In the embodiment of the present technology, it is preferable that the display section displays the plurality of optional functions which are described as necessary by the necessity information at the same time. In this configuration, the operator can confirm the necessity information regarding the plurality of optional functions without scrolling or changing the display screen by the display section.

In the embodiment of the present technology, it is preferable that the display section displays all of the optional functions which are described as necessary by the necessity information at the same time. In this configuration, the operator can specify all of the optional functions which are considered necessary without scrolling or changing the display screen by the display section. However, in another embodiment, the display section may display only apart of the plurality of optional functions which are described as necessary by the necessity information at the same time.

In the embodiment of the present technology, it is preferable that the display section displays the plurality of optional functions which are described as necessary by the necessity information at respective predetermined positions regardless of the necessity of other optional functions. In this configuration, the operator can easily grasp the plurality of optional functions which are considered necessary based on the positions of the optional functions displayed by the display section.

In the embodiment of the present technology, it is preferable that the display section displays the optional functions which are described as necessary by the necessity information, by using icons. In this configuration, the operator can easily grasp the plurality of optional functions which are considered necessary. In addition, the display section may display the plurality of optional functions which are described as unnecessary by the necessity information, by using the icons. However, in another embodiment, the display section may display at least one of the plurality of optional functions which are described as necessary by the necessity information, and the plurality of optional functions which are described as unnecessary by the necessity information, in a list form, without using the icons.

In the embodiment of the present technology, it is preferable that the display section changes at least one of the size, the shape, the color, and a behavior of the icons in accordance with the optional functions to be displayed. In this case, for example, for the optional functions to be displayed being emphasized, a large icon, an icon having a unique shape, an icon having a noticeable color, a blinking icon, or an icon in which the size or the color changes may be used. For example, with respect to the optional functions having low frequency of use, as an optional function to be displayed being emphasized, an icon which is unique in terms of at least one of the size, the shape, the color, and the operation may be used.

In the embodiment of the present technology, it is preferable that, when an operator selects an icon, the display section displays a setting screen of parameters related to the optional function that corresponds to the icon. In this configuration, the operator can confirm not only the necessity of the optional functions, but also the parameters related to the optional functions, and can set or edit the parameters.

In the embodiment of the present technology, it is preferable that the extraction processing section extracts the necessity information from two or more pieces of data. In this case, it is preferable that the display section displays the necessity information which is extracted from one piece of data by the extraction processing section, and the necessity information which is extracted from another piece of data by the extraction processing section, at the same time. In this configuration, even when the plural pieces of data are used in the production of one production lot, the operator can collectively grasp the optional functions which are considered necessary in production of the production lot.

In the embodiment of the present technology, it is preferable that the data includes part data which instructs an operation condition for each type of electronic components to the electronic component mounting machines. In this case, it is preferable that the necessity information is included in the part data. Most of the optional functions of the electronic component mounting machine are selectively used in accordance with the electronic component to be mounted regardless of the production item. Accordingly, when the necessity information regarding the optional functions is given to the part data, the part data can be commonly used regardless of the production item.

In the embodiment of the present technology, it is preferable that the display section displays a figure that illustrates the shape of the electronic component, the operation condition for which is described by the part data, at the same time as when visually displaying the necessity information described in the part data. In this configuration, the operator can presume the optional functions which are considered necessary for the electronic components from the figure illustrating the shape of the electronic component, and can grasp the optional functions which is considered necessary without a mistake.

EXAMPLE

An electronic component mounting system of an example will be described with reference to the drawings. As illustrated in FIG. 1, the electronic component mounting system of the example includes a data management device 10, a data server 100, and a plurality of electronic component mounting machines 200. The data management device 10, the data server 100, and the plurality of electronic component mounting machines 200 are connected to each other to be communicable via an electric communication line 300.

The electronic component mounting machine 200 is a device which mounts electronic components on a circuit board. An operation of the electronic component mounting machine 200 is controlled based on various pieces of data (for example, a production program 102 or part data 104) stored in the data server 100. The electronic component mounting machine 200 includes a plurality of feeders (not illustrated) which supply the electronic components, and a mounting head (not illustrated) which transports the electronic components supplied by the feeder to the circuit board and mounts the electronic components on the circuit board. The electronic component mounting machine 200 can include one or a plurality of mounting heads. In addition, the electronic component mounting machines 200 can be configured so that the plurality of mounting devices which respectively include at least one mounting head are serially connected to each other. Furthermore, the electronic component mounting machine 200 may be configured to include a solder printing machine which prints a solder on the circuit board, an inspecting device which optically inspects the circuit board, or a reflow furnace.

The data server 100 is a device which stores various pieces of data used by the electronic component mounting machine 200. For example, in the data server 100, a plurality of production programs 102 and plural pieces of part data 104 are stored. The production program 102 and the part data 104 are instructed to the electronic component mounting machine 200 through the electric communication line 300.

Figure 2:
FIG. 2 is a view illustrating contents of a production program which is an example of data used by an electronic component mounting machine.

In FIG. 2, an example of the production program 102 is illustrated. As illustrated in FIG. 2, the production program 102 is electronic data which is prepared for each production item (for example, CB001), and describes the plurality of electronic components (B column) to be mounted on the circuit board, together with a mounting order (A column), a position of a feeder (C column), a mounting position on the circuit board (D column), and another information. The electronic component mounting machine 200 mounts the plurality of electronic components described in the production program 102, to each of the mounting positions determined on the circuit board, as being operated based on the production program 102.

Figure 3:
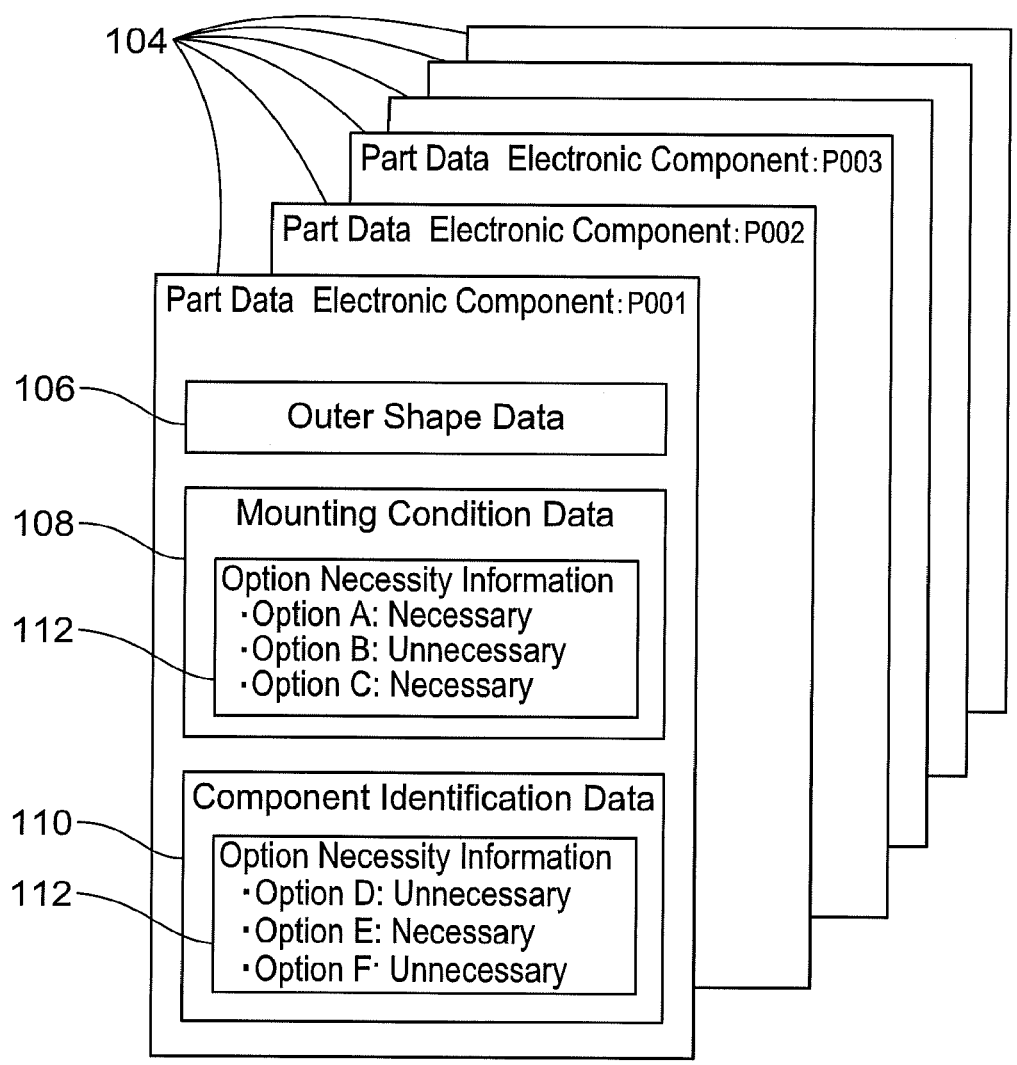
FIG. 3 is a view illustrating contents of part data which is an example of data used by the electronic component mounting machine.

In FIG. 3, an example of the part data 104 is illustrated. The part data 104 is data which is prepared for each type of electronic components (P001, P002, . . . ), and describes the operation condition of the electronic component mounting machine 200 which corresponds to the electronic component. The electronic component mounting machine 200 is operated by the operation condition described in the part data 104 with reference to the part data 104 of the electronic component for each electronic component to be mounted on the circuit board. In other words, the electronic component mounting machine 200 changes the operation for each electronic component to be mounted.

As an example, the part data 104 includes outer shape data 106, mounting condition data 108, component identification data 110. The outer shape data 106 is data which describes information related to an outer shape of the electronic component, and includes each dimension or drawing data of the electronic component. The mounting condition data 108 is data which describes the operation condition related to the mounting of the electronic component, and for example, the mounting condition data 108 includes a nozzle to be used, a suction condition in the nozzle, and a moving speed of the nozzle. The component identification data 110 is data which describes the operation condition related to the identification of the electronic component, and includes an imaging direction of the electronic component by a camera, an illumination direction at this time, and pattern matching data.

As illustrated in FIG. 3, the part data 104 further includes option necessity information 112. The option necessity information 112 is described as apart of the mounting condition data 108 or a part of the component identification data 110. The option necessity information 112 describes the necessity (that is, "necessary" or "unnecessary") of use for each optional function (optional functions A, B, . . . ) of the electronic component mounting machine 200.

The optional functions of the electronic component mounting machine 200 mean functions which are selectively used among various functions of the electronic component mounting machine 200. For example, in the optional functions, checking coplanarity or dipping flux is included. The optional functions are considered necessary in some of the electronic components or the circuit boards, but are considered unnecessary in other of the electronic components or the circuit boards. For example, as illustrated in FIG. 3, the electronic component "P001" which is an example considers three optional functions A, C, and E as necessary, and considers three optional functions B, D, and F as unnecessary. Therefore, it is necessary for the production item which uses the electronic component "P001" to be produced in the electronic component mounting machine 200 having the three optional functions A, C, and E.

The plurality of electronic component mounting machines 200 do not necessarily have the same optional functions. In other words, there are several optional functions which are included in only a part of the electronic component mounting machines 200, and which are not included in another part of the electronic component mounting machines 200. Therefore, when allocating a production item to any of the electronic component mounting machines 200, it is necessary for the operator to confirm the optional functions which are considered necessary for the production item, and to allocate the production item to the electronic component mounting machines 200 having the optional functions which are considered necessary.

Next, the data management device 10 will be described. The data management device 10 is a device for operating various pieces of data (for example, the production program 102 or the part data 104) stored in the data server 100. For example, the data management device 10 can read out various pieces of data stored in the data server 100, and visually display the contents to the operator. In addition, the data management device 10 can edit various pieces of data stored in the data server 100 based on the instruction of the operator.

As illustrated in FIG. 1, the data management device 10 includes an electronic computer 12, a display 14, a mouse 16, and a keyboard 18. The display 14, the mouse 16, and the keyboard 18 are connected to the electronic computer 12. The data management device 10 can display the contents of the data stored in the data server 100 on the display 14. In addition, the data management device 10 can copy or edit the data stored in the data server 100 based on the instruction of the operator. The mouse 16 and the keyboard 18 are user interfaces, and the operator can perform various instructions with respect to the electronic computer 12 by using the mouse 16 and the keyboard 18.

Figure 4:
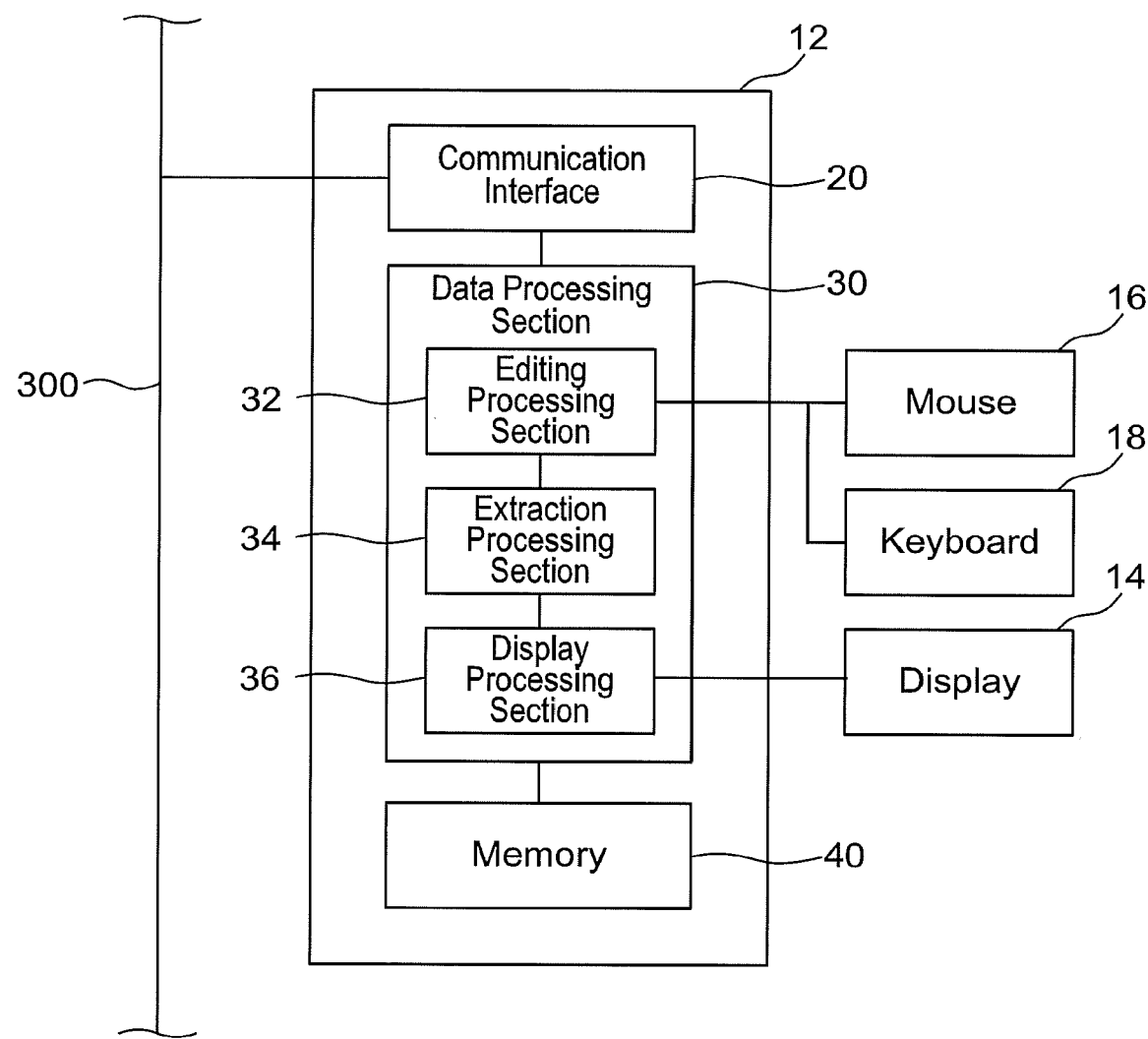
FIG. 4 is a block diagram illustrating a configuration of a data management device.

FIG. 4 is a block diagram illustrating a configuration of the data management device 10. As illustrated in FIG. 4, the electronic computer 12 is provided with a communication interface 20, a data processing section 30, and a memory 40. The communication interface 20 is connected to the data server 100 to be communicable, and obtains various pieces of data, such as the production program 102 or the part data 104, which is used by the electronic component mounting machine 200. The data processing section 30 performs various types of processing with respect to data obtained from the data server 100. The memory 40 stores data obtained from the data server 100, or data created by the data processing section 30.

The data processing section 30 mainly includes an editing processing section 32, an extraction processing section 34, and a display processing section 36. The editing processing section 32 can edit various pieces of data (for example, the production program 102 or the part data 104) which is used by the electronic component mounting machine 200, based on the instruction of the operator. The extraction processing section 34 can extract the option necessity information 112 with respect to the plurality of optional functions from various pieces of data which is used by the electronic component mounting machine 200. In addition, the display processing section 36 can visually display the option necessity information 112 extracted by the extraction processing section 34 on the display 14.

Figure 5:
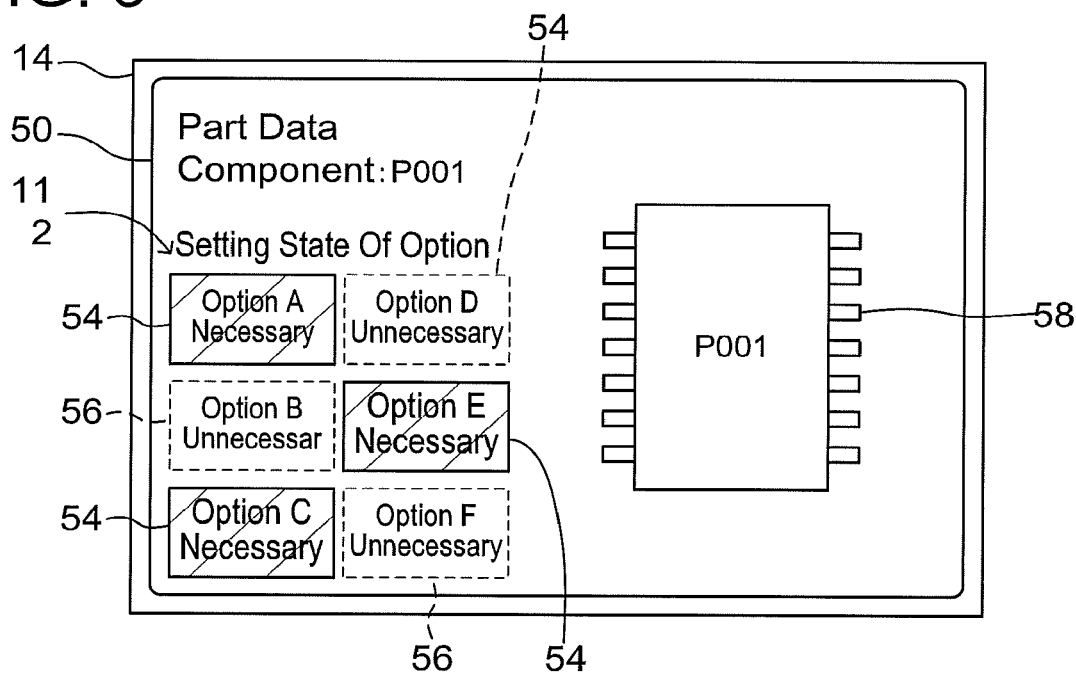
FIG. 5 is a view illustrating an example of a display screen by the data management device.

FIG. 5 illustrates an example of a display screen 50 which is displayed on the display 14 by the data management device 10. In addition, the display screen 50 illustrated in FIG. 5 is an example of an initial screen when displaying the part data 104. As illustrated in FIG. 5, on the display screen 50 (here, the initial screen of the part data 104) of the display 14, in addition to the base information of the electronic component, the option necessity information 112 extracted by the extraction processing section 34 is displayed. Accordingly, the operator can simply confirm the setting state of the option necessity information 112 described in the part data 104.

As illustrated in FIG. 5, the data management device 10 of the example displays the plurality of optional functions (here, the optional functions are the optional functions A, C, and E, and hereinafter, are referred to as necessary optional functions) which are described as necessary by the option necessity information 112, by using a first icon 54, and displays the optional functions (here, the optional functions are the optional functions B, D, and F, and hereinafter, are referred to as unnecessary optional functions) which are described as unnecessary by the option necessity information 112, by using a second icon 56. Here, the first icon 54 and the second icon 56 have different colors from each other, and the operator can easily distinguish the icons. In addition, the first icon 54 and the second icon 56 may have aspects which can be distinguished from each other, for example, at least one of the size, the shape, the color, and the behavior (for example, blinking) may be different from each other.

In the data management device 10 of the example, the display processing section 36 (and the display 14) can display both the necessary optional functions and the unnecessary optional functions at the same time. In this configuration, the operator can specify the optional function which are considered necessary without scrolling or changing the display screen 50. However, in another embodiment, the display processing section 36 (and the display 14) may display only the necessary optional functions without displaying the unnecessary optional functions.

As illustrated in FIG. 5, in the data management device 10 of the example, the display processing section 36 (and the display 14) can display the plurality of necessary optional functions at each of the predetermined positions regardless of the necessity of other optional functions. In this configuration, the operator can easily confirm the necessary optional functions based on the position displayed on the display screen 50.

Figure 6:
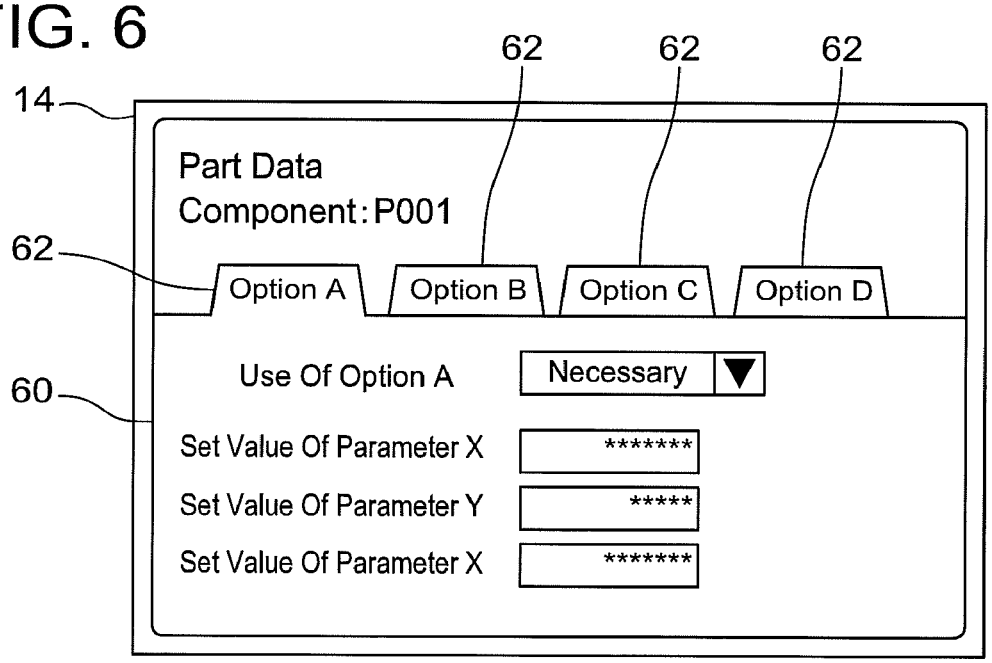
FIG. 6 is a view illustrating an example of a setting screen by the data management device.

In the data management device 10 of the example, on the display screen 50 illustrated in FIG. 5, the operator can perform an operation of selecting the icons 54 and 56. In this case, as illustrated in FIG. 6, the display processing section 36 (and the display 14) can display a setting screen 60 of the optional functions in which the necessity thereof is displayed by the selected icons 54 and 56. In the setting screen 60, the operator can select the necessity of the optional functions, and set various types of parameters regarding the optional functions. In this configuration, the operator can confirm not only the necessity of the optional functions, but also the parameters regarding the optional functions, and perform the setting or the editing of the parameters. Here, on the setting screen 60 illustrated in FIG. 6, tabs 62 are displayed for each optional function, and when the operator selects any one of the tabs 62, the setting screen 60 of the optional function that corresponds to the selected tab 62 is displayed on the display 14.

As illustrated in FIG. 5, in the data management device 10 of the example, when the display processing section 36 (and the display 14) visually displays the option necessity information 112, it is possible to display FIG. 58 which illustrate the shape of the electronic components in which the operation condition is described by the part data 104 at the same time. According to this configuration, the operator can presume the optional functions which are considered necessary for the electronic components, and grasp the optional functions which are considered necessary without a mistake, from the FIG. 58 which illustrate the shape of the electronic component.

In the data management device 10 of the example, the extraction processing section 34 can extract the option necessity information 112 from two or more pieces of part data 104. In this case, the display processing section 36 (and the display 14) can display the option necessity information 112 extracted from one piece of part data 104 by the extraction processing section 34, and the option necessity information 112 extracted from the other part data 104 by the extraction processing section 34 at the same time. According to this configuration, the operator can collectively grasp the plurality of optional functions which are considered necessary with respect to the plurality of electronic components which are used in one production item.

Figure 7:
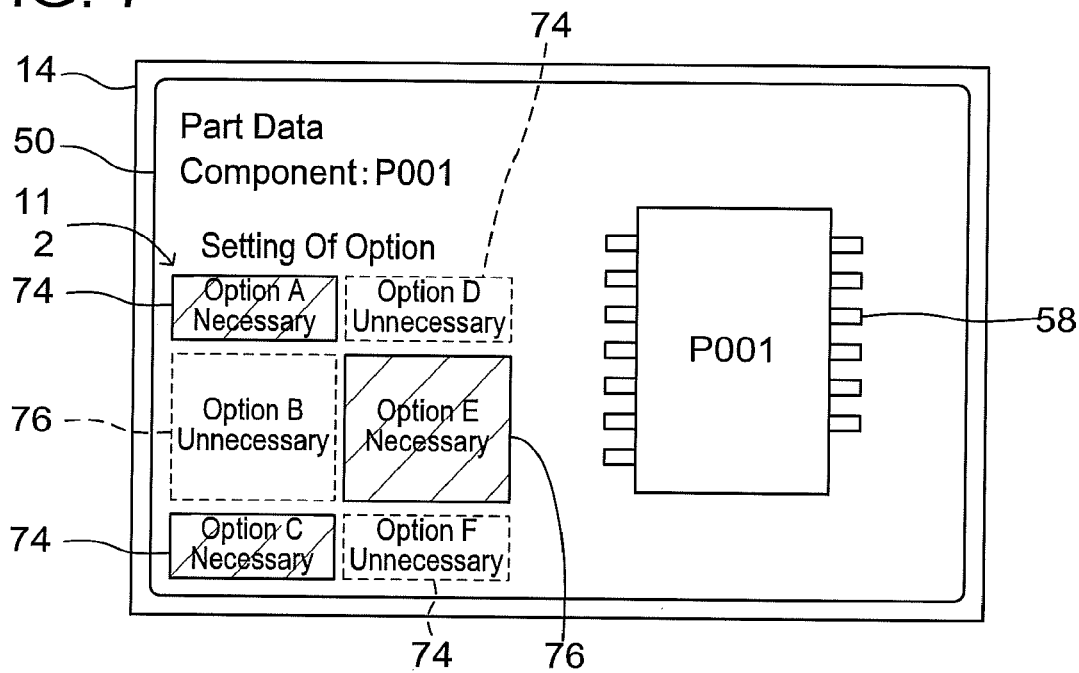
FIG. 7 is a view illustrating another example of the display screen by the data management device.

FIG. 7 illustrates another display example of the option necessity information 112 by the display processing section 36 (and the display 14). On the display screen 50 illustrated in FIG. 7, a part of the optional functions is displayed by relatively small icons 74, and a part of the optional functions is displayed by relatively large icons 76. In this manner, it is preferable that the display processing section 36 (and the display 14) changes the sizes of the icons 74 and 76 in accordance with the optional functions to be displayed. Otherwise, the display processing section 36 (and the display 14) may change at least one of the shape, the color, and the behavior (for example, blinking) of the icons 74 and 76 in accordance with the optional functions to be displayed, not being limited to the size of the icons 74 and 76. In this case, for example, with respect to the optional functions having low frequency of use, as an optional function to be displayed being emphasized, an icon which is unique in terms of at least one of the size, the shape, the color, and the behavior may be used.

Figure 8:
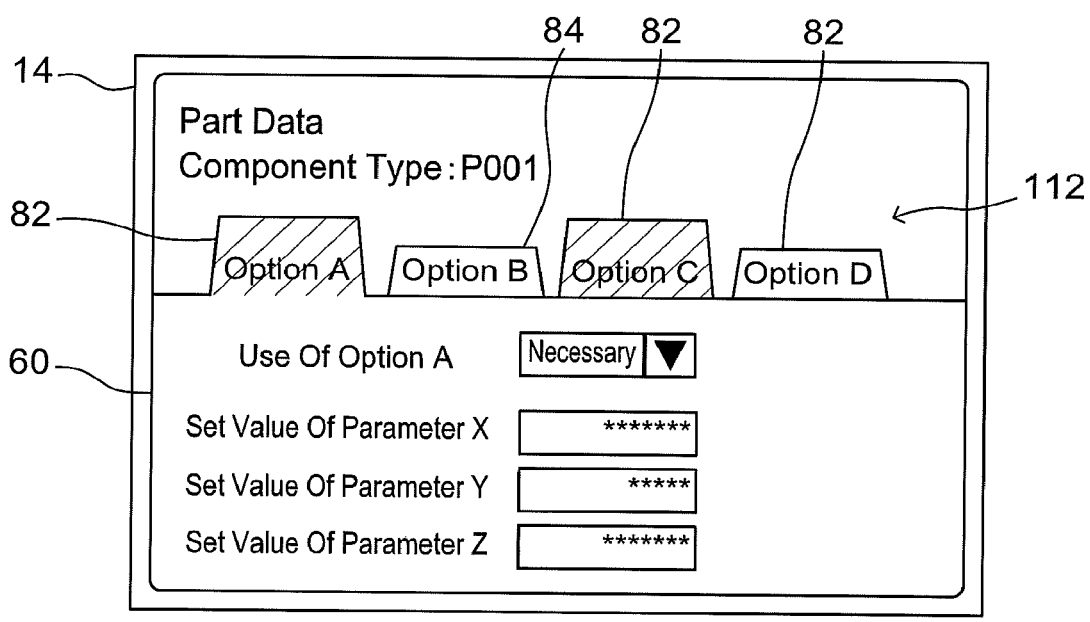
FIG. 8 is a view illustrating another example of the setting screen by the data management device.

FIG. 8 illustrates another display example of the option necessity information 112 by the display processing section 36 (and the display 14). As illustrated in FIG. 8, the display processing section 36 (and the display 14) may display the option necessity information 112 on the setting screen 60 of the part data 104. In this case, the option necessity information 112 may change the state (for example, at least one of the size, the shape, the color, and the behavior) of tabs 82 displayed for each optional function in accordance with the necessity of the optional function.

Above, a specific example of the present disclosure is described in detail, but this is merely an example, and does not limit the claims. In the technology described in the claims, the specific example described above includes various modifications and changes.

For example, in the system of the example, the data management device 10 has a function as a device which visually displays the option necessity information 112. However, in another embodiment of the present technology, the electronic component mounting machine 200 may have a function as a device which visually displays the option necessity information 112. Otherwise, the device which visually displays the option necessity information 112 may be a portable electronic computer, such as a smartphone or a tablet.

Otherwise, in the system of the example, the option necessity information 112 is described in the part data 104. However, in another embodiment of the present technology, the option necessity information 112 may be described in another data, such as the production program 102 or the job data, which is used by the electronic component mounting machine 200. Here, the job data is data which describes at least the production item and the volume of production, and which is typically prepared for each production lot.

Technical elements described in the present specification and the drawings show technical usability as being alone or in combination, and are not limited to the combination described in claims of the patent application. In addition, the technology illustrated as an example in the present specification or the drawings achieve plural purposes at the same time, and has the technical usability by achieving any one of the purposes.

REFERENCE SIGNS LIST

10: data management device
12: electronic computer
14: display
30: data processing section
32: editing processing section
34: extraction processing section
36: display processing section
50: display screen
54, 56, 74, 76: icon
60: setting screen
100: data server
102: production program
104: part data
112: option necessity information
200: electronic component mounting machine
300: electric communication line

The invention claimed is:

1. A display device for displaying contents of data associated with operation of a plurality of electronic component mounting machines at a production site, the display device comprising:

a display; and
one or more processors configured to:
extract necessity information from the data associated with the operation of the electronic component mounting machines, wherein
the necessity information describes necessity of use of each of a plurality of functions, which are respectively selectively usable in the electronic component mounting machines for production of workpieces by the electronic component mounting machines,
each of the plurality of functions is a function that is an interaction between one of the electronic component mounting machines and a corresponding production lot of workpieces for the production of the workpieces of the production lot,
a function, of the plurality of functions, that is described as necessary by the necessity information is a function that is required in a process performed by the one of the electronic component mounting machines for the production of the workpieces of the production lot, and
a function, of the plurality of functions, that is described as unnecessary by the necessity information is a function that is not required in the process performed by the one of the electronic component mounting machines for the production of the workpieces of the production lot;
cause the display to display a plurality of icons each corresponding to a respective function of the plurality of functions; and
cause the display to display each of the icons so as to demonstrate the necessity information of the respective function including:

displaying an icon of the function that is described as necessary, displaying an icon of the function that is described as unnecessary, and displaying the icon of the function that is described as necessary and the icon of the function that is described as unnecessary such that they are distinguished by at least one of at least one of a size, a shape, a color, and a behavior so as to demonstrate the necessity information of the function that is described as necessary and the necessity information of the function that is described as unnecessary, wherein the data associated with the operation of the electronic component mounting machines includes part data which instructs an operation condition for each type of electronic component, and the one or more processors is configured to cause the display to display a figure that illustrates a shape of the electronic component and the operation condition described by the part data at the same time as when displaying the plurality of icons.

2. The device according to claim 1, wherein the one or more processors is configured to cause the display to display a plurality of necessary icons corresponding to functions of the plurality of functions which are described as necessary by the necessity information at the same time.

3. The device according to claim 1, wherein the one or more processors is configured to cause the display to display a plurality of necessary icons corresponding to all functions of the plurality of functions which are described as necessary by the necessity information at the same time.

4. The device according to claim 1, wherein the one or more processors is configured to cause the display to display a plurality of necessary icons corresponding to functions of the plurality of functions which are described as necessary by the necessity information at respective predetermined positions regardless of necessity of other functions of the plurality of functions.

5. The device according to claim 1, wherein
when an operator selects one of the icons, the one or more processors is configured to cause the display to display a setting screen, and
a setting screen includes parameters related to the function of the plurality of functions that corresponds to the one of the icons.

6. The device according to claim 1, wherein the one or more processors is configured to:
extract the necessity information from two or more pieces of instruction data, and
cause the display to display the necessity information which is extracted from one piece of the two or more pieces of instruction data and the necessity information which is extracted from another piece of the two or more pieces of instruction data at the same time.

7. The device according to claim 1, wherein the one or more processors is configured to cause the display to simultaneously display the plurality of icons.

8. The device according to claim 1, wherein the one or more processors is configured to:
cause the display to display the icon of the function which is described as necessary as selectable, and
cause the display to display the icon of the function which is described as unnecessary as selectable.

9. The device according to claim 1, wherein
when an operator selects the icon of the function which is described as necessary, the one or more processor is configured to cause the display to display a setting screen for the function which is described as necessary,
the setting screen includes parameters related to the function which is described as necessary,
the setting screen includes the icon of the function which is described as necessary,
the setting screen includes the icon of the function which is described as unnecessary in a manner that demonstrates that the function which is described as unnecessary is unnecessary without having to scroll or change the display.

10. The device according to claim 1, wherein the one or more processors is configured to cause the display to display a plurality of necessary icons corresponding to functions of the plurality of functions which are described as necessary by the necessity information.

11. The device according to claim 10, wherein the one or more processors is configured to cause the display to display a plurality of unnecessary icons corresponding to functions of the plurality of functions which are described as unnecessary by the necessity information.

12. A system comprising:
the display device according to claim 1; and
the electronic component mounting machines, wherein
the workpieces are circuit boards, and
the electronic component mounting machines mount electronic components on the circuit boards in accordance with the data.

13. The system according to claim 12, wherein the display device is a part of the one of the electronic component mounting machines.

14. The device according to claim 1, wherein the one or more processors is configured to:
cause the display to display a setting screen;
cause the display to display an indicator of the necessity of use of one of the plurality of functions on the setting screen based on the necessity information;
cause the display to display the indicator of the necessity of use of the one of the plurality of functions as necessary based on the necessity information;
accept setting of the necessity information of the one of the plurality of functions as unnecessary via the setting screen;
cause the display to display the indicator of the necessity of use of the one of the plurality of functions as unnecessary based on the setting of the necessity information.

15. The device according to claim 14, wherein the one or more processors is configured to cause the display to display the indicator of the necessity of use of the one of the plurality of functions as a label.

* * * * *